(12) United States Patent
Makiya

(10) Patent No.: US 6,507,048 B1
(45) Date of Patent: Jan. 14, 2003

(54) LIGHT COUPLED DEVICE WITH INSULATING AND LIGHT SHIELDING ELEMENT AND LIGHT INSULATING AND TRANSMITTING ELEMENT

(75) Inventor: Katsunori Makiya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1 day.

(21) Appl. No.: 09/643,905

(22) Filed: Aug. 23, 2000

(30) Foreign Application Priority Data

Aug. 23, 1999 (JP) .......................................... 11-235644

(51) Int. Cl.[7] ...................... H01L 33/00; H01L 31/0232
(52) U.S. Cl. ............................. 257/81; 257/82; 257/98; 257/99; 257/100; 257/433; 257/435
(58) Field of Search ............................... 257/80–84, 99, 257/100, 432, 433, 98, 435

(56) References Cited

U.S. PATENT DOCUMENTS

| 5,665,983 A | * | 9/1997 | Nagano | ........................ 257/81 |
| 5,838,174 A | | 11/1998 | Nakagawa et al. | ........... 257/83 |

FOREIGN PATENT DOCUMENTS

| JP | 59-177978 | * | 10/1984 |
| JP | 4-79380 | * | 3/1992 |
| JP | 5251731 | | 9/1993 |
| JP | 9092873 | | 4/1997 |
| JP | 09-307135 | * | 11/1997 |

* cited by examiner

Primary Examiner—Minh Loan Tran
(74) Attorney, Agent, or Firm—Birch, Stewart, Kolasch & Birch

(57) ABSTRACT

The invention provides a lead frame size requiring a reduced area, and a package reduced in size. Adjacent light couplings have an insulating and light shielding element disposed therebetween to block a light transmission from one to the other. The insulating and light shielding element allows the light couplings to be arranged close together while preventing crosstalk occurring therebetween. In another construction, a primary light coupling section and a secondary light coupling section are formed around each light emitting element on the primary side and each light receiving element on the secondary side. The primary and secondary light coupling sections are optically interconnected through an insulating and light transmitting element. This construction realizes optical paths of reduced volume, and secures a sufficient distance for preventing crosstalk even where adjacent light couplings are arranged with a reduced distance therebetween.

3 Claims, 4 Drawing Sheets

LIGHT COUPLED DEVICE WITH INSULATING AND LIGHT SHIELDING ELEMENT AND LIGHT INSULATING AND TRANSMITTING ELEMENT

BACKGROUND OF THE INVENTION

1. Field of the Invention

The present invention relates to a light coupled device such as a 2-channel photocoupler having a plurality of light couplings.

2. Description of the Related Art

A signal transmitting interface in factory automation equipment or the like requires electrical insulation from external devices, and besides is used in an environment filled with influence of external noise, and accordingly a photocoupler is used as the signal transmitting interface. The photocoupler used in the interface must have a high-speed performance (high-speed signal transmission), and a plurality of photocouplers are required since the interface has a plurality of inputs and outputs. Generally, multi-channel type light coupled devices are used, each of which includes a plurality of light couplings in one package.

One example of such multi-channel type light coupled devices is shown in FIGS. 4A through 4C, 5 and 6.

FIGS. 4A through 4C show an outward appearance of a conventional multi-channel type light coupled device, in which FIG. 4A is a front view, FIG. 4B a side view and FIG. 4C a plan view. FIG. 5 is a view showing an interconnection in the light coupled device shown in FIGS. 4A through 4C. FIG. 6 shows a layout of a lead frame on the light receiving side as shown in FIG. 5.

To realize a high-speed performance, the 2-channel type light coupled device shown in FIGS. 4A through 4C, 5 and 6 employs light receiving elements each having a photodiode and a light signal processing circuit integrated into a single chip by bipolar IC process. Each light receiving element, acting as an element on the output (or secondary) side, has three external connectors, i.e. a source voltage terminal Vcc, a GND terminal and an output terminal Vo. In this example, two light receiving elements 2A and 2B are provided. Since the two light receiving elements can share the source voltage terminal Vcc and GND terminal, a connecting method may be employed therefor, as shown in FIG. 6, in which light receiving elements 2A and 2B are connected through a metal wire to a lead frame 3 to connect the source terminal Vcc of the light receiving elements 2A and 2B to the external terminal Vcc leading to the lead frame 3. Thus, while the two light receiving elements 2A and 2B each with three external connectors are built in, this construction requires a total of only four external terminals which are the common source voltage terminal Vcc, an output terminal Vo1 (i.e. output terminal of light receiving element 2A), an output terminal Vo2 (i.e. output terminal of light receiving element 2B) and the common GND terminal.

Where each of the light receiving elements 2A and 2B has three terminals to make a total of six terminals on the secondary side (output side), the result will be a 12-pin package. By sharing certain terminals as noted above, the number of terminals on the secondary side will be four, which provides a simplified package having only eight pins as shown in FIG. 4. In this way, a light coupled device with a plurality of light couplings, generally, has some of the terminals shared by the light receiving elements in order to achieve compactness and low cost of the product.

In a widely used construction of a multichannel type light coupled device, each light emitting element and an associated light receiving element have a transparent silicone resin filled therebetween to form a light coupling which is sealed with an epoxy resin. One such example is shown in FIG. 7.

FIG. 7 is a sectional view schematically showing light coupled sections of a conventional multi-channel type light coupled device.

In FIG. 7, adjacent light couplings 24 are formed of a transparent silicone resin. Light emitted from each light emitting element 1 passes through a light coupling 24 formed of the transparent silicone resin, and directly reaches the opposite light receiving element 2. Part of the light from the light emitting element 1 is reflected from the boundary between the silicone resin and an adjoining epoxy resin 25 to reach the light receiving element 2. In this way, the epoxy resin 25 filled between the two light couplings 24 formed of the transparent silicone resin plays a role of blocking light transmission between the channels so that light emitted from the light emitting element 1 of one channel is prevented from reaching the light receiving element 2 of the other, adjacent channel, in order to avoid an interference of light signals (hereinafter referred to as "crosstalk") between the two light couplings 24.

The two-channel type light coupled device shown in FIG. 5 requires a construction in which signals inputted to input terminals T1 and T2 result in a signal outputted from an output terminal T7, while signals inputted to input terminals T3 and T4 result in a signal outputted from an output terminal T6.

That is, it is necessary to ensure that the input signals to the input terminals T1 and T2 exert no influence, such as crosstalk, on the output signal from the output terminal T6, and that the input signals to the input terminals T3 and T4 exert no influence on the output signal from the output terminal T7. For this purpose, each light coupling 24 shown in FIG. 7 must be formed of the transparent silicone resin, and the two adjacent light couplings 24 must be spaced apart to be out of contact with each other. This requirement has been a limitational factor in an area saving designing of lead frame size and downsizing (volume saving) of packages.

SUMMARY

The present invention has been made having regard to the state of the noted above, and its object is to provide a multichannel type light coupled device with a construction for enabling an area saving designing of lead frame size and downsizing (volume saving) of packages.

In one aspect of the invention there is provided a light coupled device comprising a plurality of light couplings and an insulating and light shielding element disposed between the light couplings arranged adjacent each other.

The light coupled device according to the invention prevents crosstalk since the insulating and light shielding element blocks light transmission between the adjacent light couplings. This construction, compared with the conventional construction (FIG. 7), realizes a reduced distance between the adjacent light couplings.

The insulating and light shielding element used in the light coupled device according to the invention may comprise a polyimide film or silica glass sheet with a light shielding color applied thereto.

A light shield may be effected between the adjacent light couplings by using an insulating and light shielding polyimide film or silica glass sheet. Even though the light couplings are arranged close together, no crosstalk will occur therebetween.

Further, in the invention it is preferable that projections or recesses are formed on/in a lead frame on which the light couplings are mounted, for fixing the insulating and light shielding element to a predetermined position between the light couplings.

In the light coupled device according to the invention, with the projections or recesses formed on/in the lead frame for fixing the insulating and light shielding element to a predetermined position between the light couplings, the light shielding element does not become displaced when a transparent silicone resin is injected to form the light couplings. Consequently, the light shielding element may be fixed to an optimal position in the middle between the adjacent light couplings.

Further, in the invention it is preferable that the insulating and light shielding element is fixed by an adhesive to the lead frame on which the light couplings are mounted.

The insulating and light shielding element may be fixed to the lead frame by using an adhesive such as an epoxy resin, instead of the projections or recesses. With this measure also, the insulating and light shielding element may be fixed to the optimal position in the middle between the adjacent light couplings.

In another aspect of the invention, there is provided a light coupled device comprising a plurality of light couplings, each of the light couplings including, at least, a primary light coupling section and a secondary light coupling section formed of a light transmitting filler around a light emitting element on a primary side and a light receiving element on a secondary side of the light coupled device, and an insulating and light transmitting element disposed between the primary light coupling section and the secondary light coupling section for optically interconnecting the primary light coupling section and the secondary light coupling section.

The light transmitting filler may be a transparent silicone resin.

In the invention it is preferable that the primary and secondary light coupling sections are formed of a transparent silicone resin around the light emitting element on the primary side and the light receiving element on the secondary side, respectively, the primary light coupling section and the secondary light coupling section being optically interconnected through an insulating and light transmitting element, the primary light coupling section, the secondary light coupling section and the insulating and light transmitting element constituting each of the light couplings. the above light coupled device according to the invention, the primary light coupling section and secondary light coupling section formed of a light transmitting filler such as a transparent silicone resin are optically interconnected through the insulating and light transmitting element. This construction realizes an optical path of reduced volume, compared with a case where each light coupling is formed only of a light transmitting filler such as a transparent silicone resin. A sufficient distance is secured between the light couplings for preventing crosstalk therebetween even though the lead frames are reduced in size. Thus, the light couplings may be arranged closer together than in the conventional construction (FIG. 7).

The insulating and light transmitting element used in the light coupled device according to the invention may comprise a silica glass sheet. The insulating and light transmitting element is not limited to a particular shape, but may be cylindrical, spherical or cubic, for example..

The primary light coupling section and secondary light coupling section may be optically interconnected by using a silica glass sheet, which realizes an optical path of reduced volume, compared with a case of forming each light coupling only of the light transmitting filler. By using a cylindrical, spherical or cubic insulating and light transmitting element, the primary light coupling section and secondary light coupling section may be optically interconnected in a uniform way, to realize an optical path of reduced volume.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
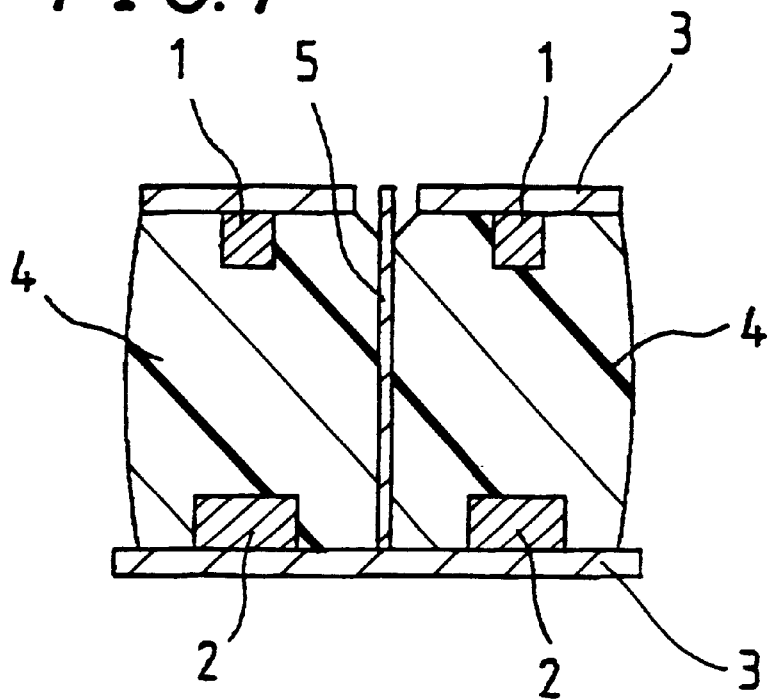
FIG. 1 is a sectional view schematically showing light couplings in one embodiment of the present invention.

Now referring to the drawings, preferred embodiments of the invention are described below.

FIG. 1 is a sectional view schematically showing light couplings of a light coupled device in Embodiment 1 of the invention.

Figure 7:
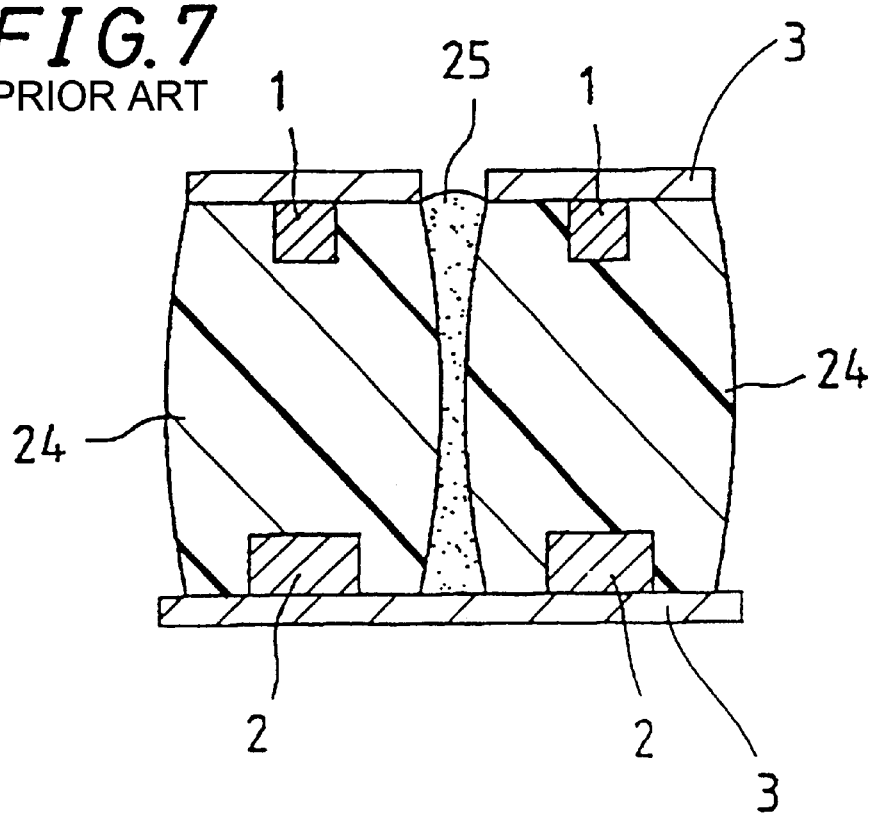
FIG. 7 is a sectional view schematically showing light couplings of a conventional multi-channel type light coupled device.

The light coupled device shown in FIG. 1 is a 2-channel type photocoupler similar to that shown in FIG. 7. This device includes two pairs of light emitting elements 1 consisting of light emitting diodes and light receiving elements 2 consisting of light receiving diodes mounted on lead frames 3 to be opposed to each other.

A transparent silicone resin is filled between each pair of light emitting element 1 and light receiving element 2 to act as a light coupling 4. The light coupled device in this example is characterized by an insulating and light shielding film 5 disposed between the two adjacent light couplings 4, i.e. in a middle position of the light couplings 4 seen as a whole. This film 5 is formed by applying a light shielding color to a polyimide film. The insulating and light shielding film 5 isolates the two light couplings 4 from each other so that no light is transmitted from one to the other. Thus, even though the two light couplings 4 are arranged close together, no crosstalk will occur therebetween.

Embodiment 1 employs, as an insulating and light shielding element,the insulating and light shielding film 5 formed by applying a light shielding color to a polyimide film. Instead of the film 5, a silica glass sheet with a light shielding color applied thereto may be disposed between the two light couplings 4 to produce a similar effect.

Figure 2:
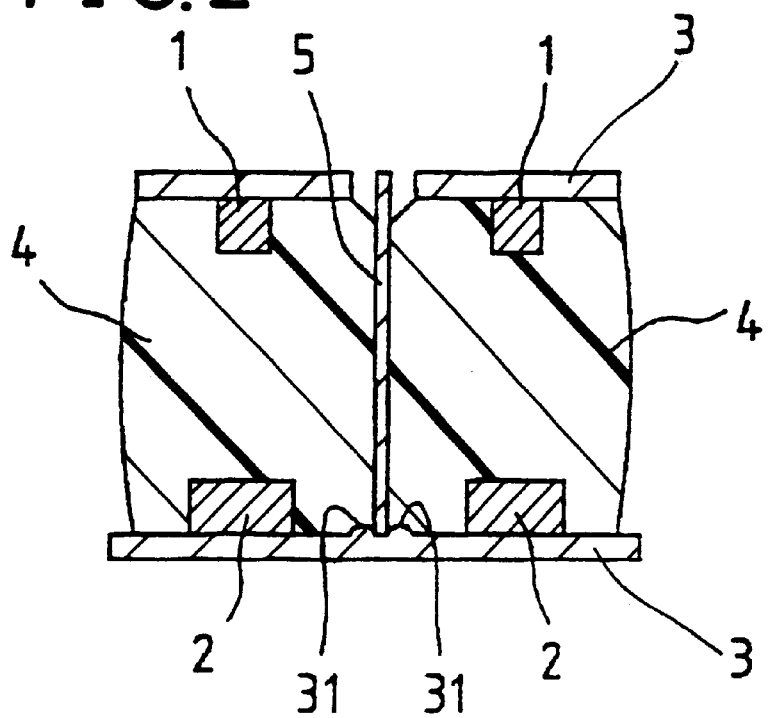
FIG. 2 is a sectional view schematically showing light couplings in another embodiment of the invention.

FIG. 2 is a sectional view schematically showing light couplings of a light coupled device in Embodiment 2 of the invention.

Embodiment 2 shown in FIG. 2 is characterized by an addition to the construction shown in FIG. 1 of projections 31 formed on the lead frame 3 associated with the light receiving elements 2, for positioning and fixing the insulating and light shielding film 5 between the two adjacent light couplings 4, i.e. in the middle position of the light couplings 4 seen as a whole. These projections 31 are effective to prevent the light shielding film 5 becoming displaced when the transparent silicone resin is injected to form the light couplings 4. Consequently, the light shielding film 5 may be fixed to an optimal position in the middle between the light couplings 4.

The projections 31 may be replaced with positioning and fixing recesses formed in the lead frame 3. Instead of forming the projections or recesses, the light shielding film 5 may be fixed to the lead frame 3 by means of an epoxy resin.

The construction for fixing the insulating film 5 with the projections, recesses or epoxy resin described above, of course, is applicable where a silica glass sheet or the like with a light shielding color applied thereto is used.

Figure 3:
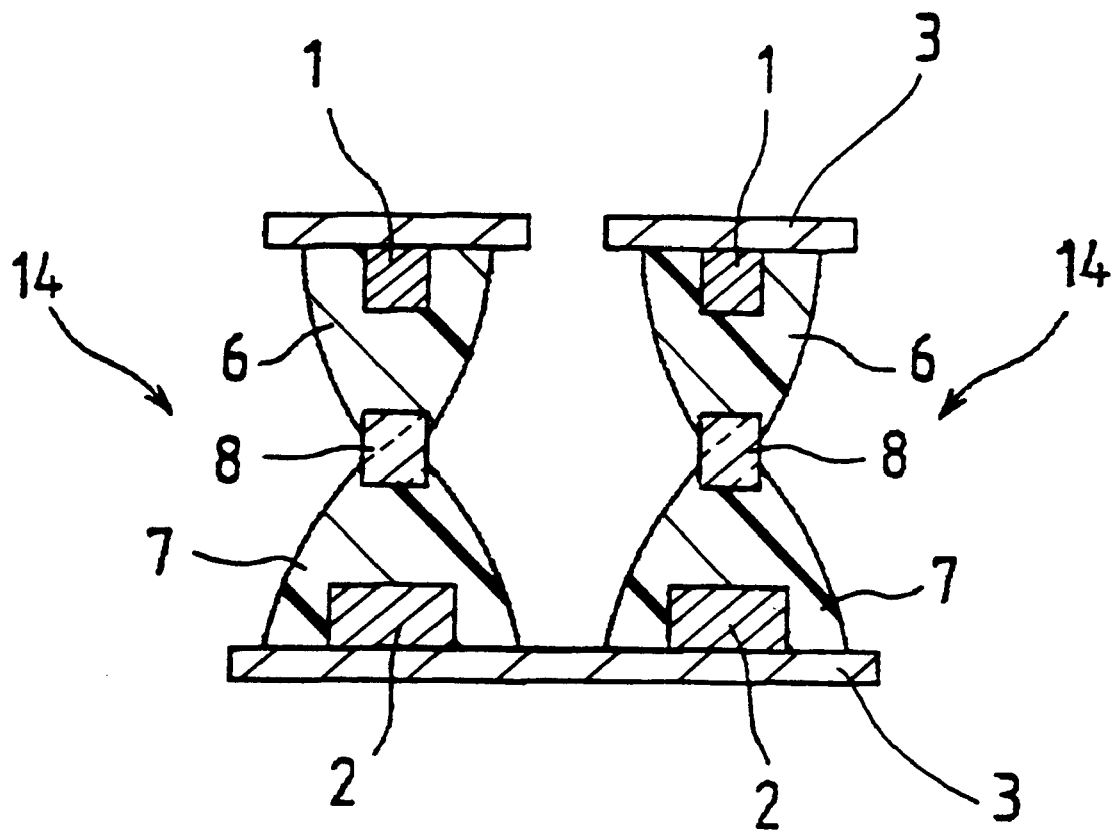
FIG. 3 is a sectional view schematically showing light couplings in a further embodiment of the invention.
Figure 4C:
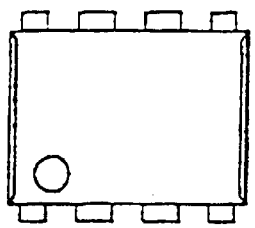
FIG. 4B is a side view and FIG. 4C is a plan view showing an outward appearance of a conventional multi-channel type light coupled device.
Figure 4B:
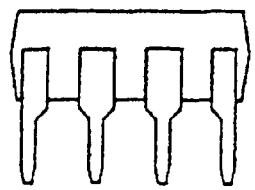
Figure 4A:
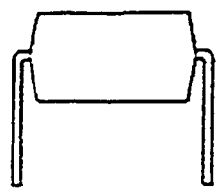
FIG. 4A is a front view.
Figure 5:
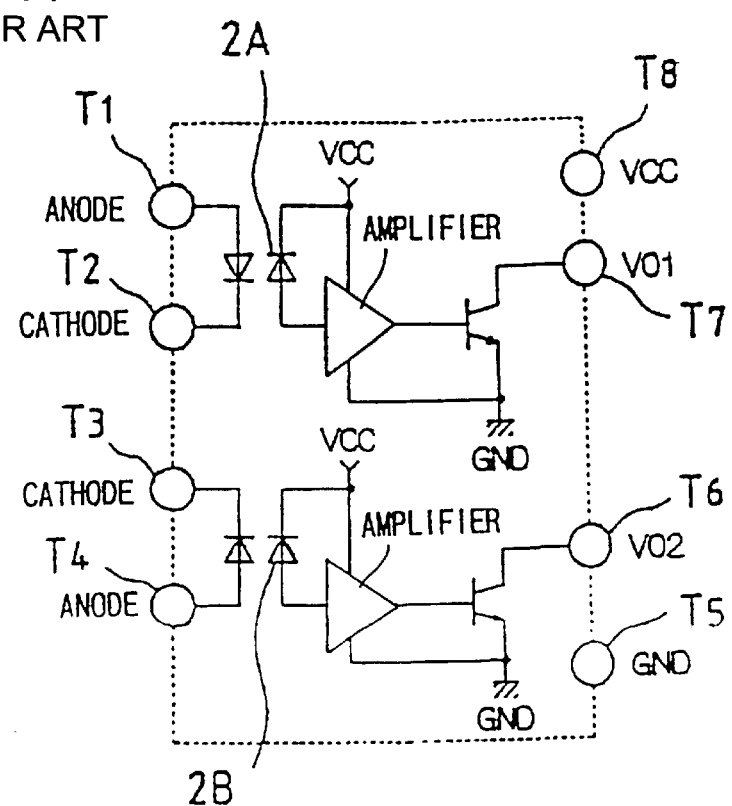
FIG. 5 is a view showing an interconnection in the conventional multi-channel type light coupled device.
Figure 6:
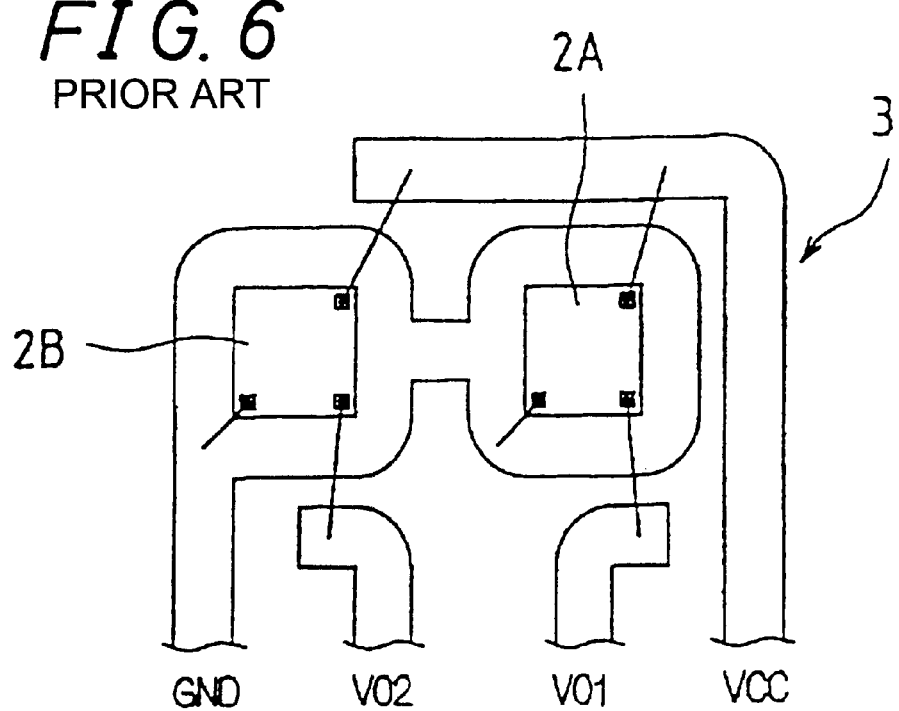
FIG. 6 is a view showing a layout of a lead frame on the light receiving side of the conventional multi-channel type light coupled device.

FIG. 3 is a sectional view schematically showing light couplings of a light coupled device in Embodiment 3 of the invention.

The light coupled device shown in FIG. 3 is a 2-channel type photocoupler having two pairs of light emitting elements 1 (light emitting diodes) and light receiving elements 2 (light receiving diodes) mounted on lead frames 3 to be opposed to each other.

A primary light coupling section 6 and a secondary light coupling section 7 are formed of a transparent silicone resin around each light emitting element 1 on the primary side and each light receiving element 2 on the secondary side. The primary light coupling section 6 and secondary light coupling section 7 are optically interconnected through a cylindrical silica glass element 8 (insulating and light transmitting element). The primary light coupling section 6, secondary light coupling section 7 and silica glass element 8 constitute a light coupling 14.

Where, in the construction shown in FIG. 3, each light coupling were formed only of the silicone resin, without the interposition of an insulating and light transmitting element, variations in viscosity of the silicone resin would destabilize the formation. Thus, where a plurality of light couplings are arranged adjacent each other, a relatively large margin is required in the distance between the light couplings to accommodate possible dimensional inaccuracies of the light couplings formed of the silicone resin. By contrast, the light coupled device in Embodiment 3, with the silica glass elements 8 arranged in the middle positions between the lead frames 3 on the primary side and the lead frame 3 on the secondary side, reduces variations of the silicone resin forming the primary light coupling sections 6 and secondary light coupling sections 7, thereby allowing the light couplings 14 to have a slim configuration as shown in FIG. 3. This results in optical paths of reduced volume. Thus, compared with the construction shown in FIG. 7, a sufficient distance is secured for preventing crosstalk even though the adjacent light couplings are arranged with a reduced distance therebetween and the lead frames 3 are reduced in size.

The silica glass elements used in Embodiment 3 may be spherical, cubic or otherwise, apart from being cylindrical.

As described hereinbefore, a light coupled device according to the invention has an insulating and light shielding element disposed between adjacent light couplings. The light shielding element allows the light couplings to be arranged close to each other while preventing crosstalk occurring therebetween. This construction achieves a reduction in package size and a reduced area for mounting.

Another type of light coupled device according to the invention has a primary light coupling section and a secondary light coupling section formed of a transparent silicone resin around each light emitting element on the primary side and each light receiving element on the secondary side. The primary light coupling section and secondary light coupling section are optically interconnected through an insulating and light transmitting element. This construction realizes optical paths of reduced volume. Thus, a sufficient distance is secured for preventing crosstalk even where adjacent light couplings are arranged with a reduced distance therebetween, thereby achieving a reduction in package size and a reduced area for mounting.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A light coupled device comprising:
   a plurality of light couplings; and
   an insulating and light shielding element disposed between the light couplings arranged adjacent to each other wherein the insulating and light shielding element comprises at least one of a polyimide film with a light shielding color applied thereto and a silica glass sheet with a light shielding color applied thereto.

2. The light coupled device of claim 1, wherein projections or recesses are formed on/in a lead frame on which the light couplings are mounted, for fixing the insulating and light shielding element to a predetermined position between the light couplings.

3. The light coupled device of claim 1, wherein the insulating and light shielding element is fixed by an adhesive to the lead frame on which the light couplings are mounted.

* * * * *